United States Patent [19]

Johnson

[11] 4,172,741
[45] Oct. 30, 1979

[54] METHOD FOR LASER TRIMMING OF BI-FET CIRCUITS

[75] Inventor: Robert F. Johnson, Mesa, Ariz.

[73] Assignee: National Semiconductor Corporation, Santa Clara, Calif.

[21] Appl. No.: 830,979

[22] Filed: Sep. 6, 1977

[51] Int. Cl.$^2$ .................... H01L 21/265; B23K 9/00
[52] U.S. Cl. .................... 148/1.5; 148/187; 219/121 L; 357/23; 357/91; 427/53
[58] Field of Search .............. 29/574, 582; 219/121 L; 427/53; 357/91, 23; 148/1.5, 187

[56] References Cited

U.S. PATENT DOCUMENTS

| | | | |
|---|---|---|---|
| 3,597,579 | 8/1971 | Lumley | 219/121 L |
| 3,801,366 | 4/1974 | Lemelson | 117/212 |
| 3,940,289 | 2/1976 | Marquardt et al. | 148/1.5 |
| 3,992,819 | 11/1976 | Schmall | 51/8 R |
| 4,059,461 | 11/1977 | Fan et al. | 148/1.5 |

OTHER PUBLICATIONS

Industrial Lasers & Their Applications, J. E. Harry, McGraw Hill, 1974, N.Y., pp. 136–138.
Uglov, "Lasers in Metallurgy . . . ," Sov. J. Quent. Electron., 4 (1974) 564.
Hutchins, "Localized . . . Diffusions . . . Laser Melting . . .," IBM-TDB, 16 (1974) 2585.
Braun et al., "Laser Adjustable Resistors . . .," Solid State Tech. 12 (1969) 56.
Ban et al., "Thin Films . . . Dielectrics . . . by Laser . . .," J. Mat. Sc. 5 (1970) 974.

Primary Examiner—L. Dewayne Rutledge
Assistant Examiner—Upendra Roy
Attorney, Agent, or Firm—Gail W. Woodward

[57] ABSTRACT

Radiant energy, preferably that of a laser, is focused onto the surface of a silicon integrated circuit that contains a thin layer doped to the opposite conductivity type of the underlying silicon. The thin layer can be trimmed so as to tailor its conductivity. Such layers when used in JFET, diode, bipolar transistor, or resistor structures can therefore be precision trimmed. In particular, JFET pairs can be trimmed to a very close match.

14 Claims, 4 Drawing Figures

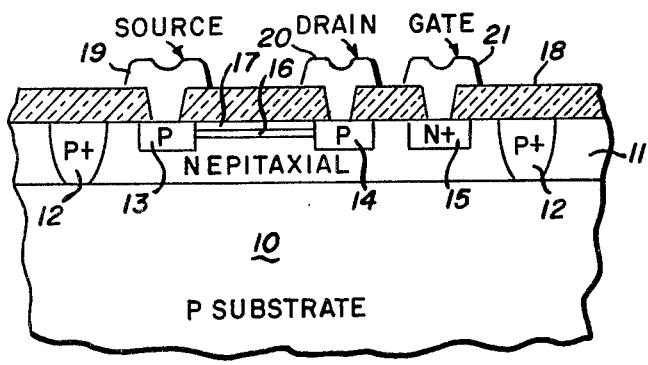
Fig_1 PRIOR ART
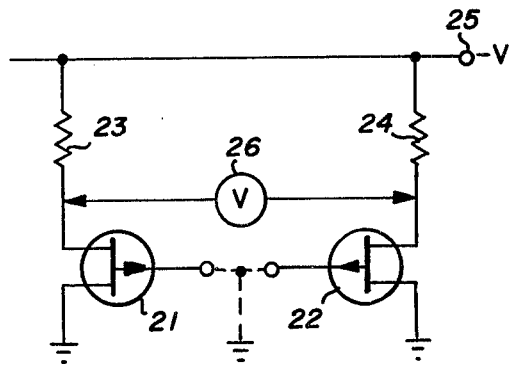
Fig_2
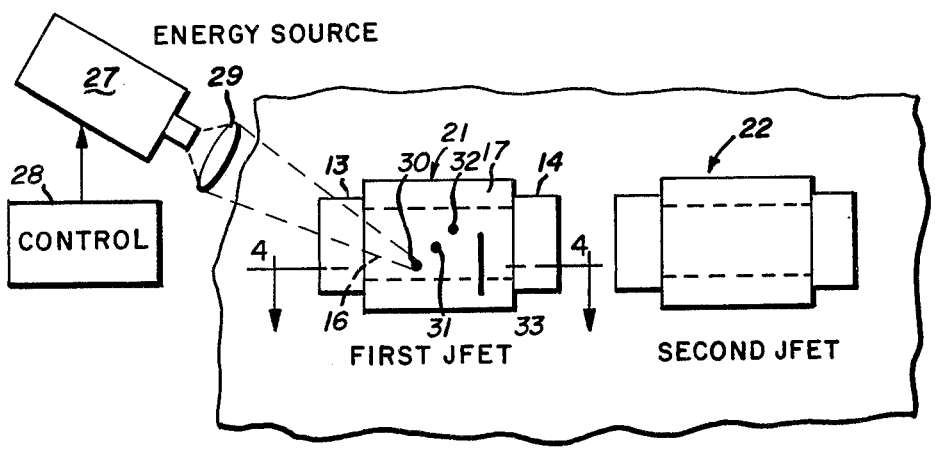
Fig_3
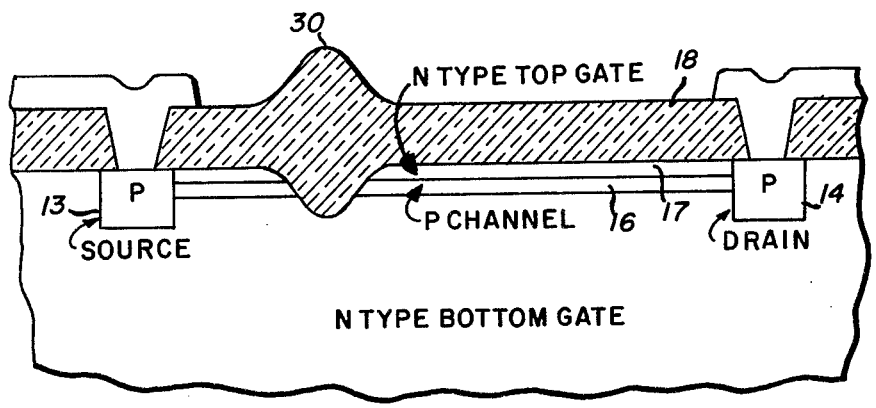
Fig_4

METHOD FOR LASER TRIMMING OF BI-FET CIRCUITS

BACKGROUND OF THE INVENTION

It is well known that thick film and thin film resistors can be laser trimmed to precise values. Such devices are located on top of an insulating substrate and their trimming consists of removal of the material such as by vaporization. Abrasive blasting and other known mechanical cutting methods have also proven practical. However, such methods that result in the removal of material have proven unworkable when applied to semiconductor elements. In particular such methods have been regarded as destructive to semiconductor IC structures. Accordingly, in the prior art, IC devices are manufactured to as close tolerance as possible. In some cases, provision is made for connecting external adjustment elements that react electrically with the IC. In other cases the IC metallization pattern contains shorting links that are associated with IC resistor elements. As the shorting links are severed, as by a laser or other means, the resistance value can be adjusted after IC manufacture. This method results in step or incremental variations and can only be adjusted to the nearest step value. It would be desirable to eliminate the need for such adjustments.

SUMMARY OF THE INVENTION

It is an object of the invention to provide a method for trimming thin layers of semiconductor located in a fully fabricated monolithic integrated circuit.

It is a further object of the invention to provide a method for trimming thin layers of semiconductor of one conductivity type located near the surface of a semiconductor body of the opposite conductivity type.

It is a still further object of the invention to provide a method for trimming thin electrode diodes.

It is a still further object of the invention to provide a method for trimming thin electrode elements in bipolar transistors.

It is a still further object of the invention to provide a method of trimming thin layer JFET devices to create a matched pair in a monolithic semiconductor integrated circuit.

These and other objects are achieved in the method to be described below. Radiant energy, such as that produced by a laser, is focused to a small spot on the surface of a semiconductor integrated circuit (IC). The energy is controlled to generate localized heating sufficient to produce a surface reaction in the semiconductor. If desired, the focused spot can be translated so as to extend the reacted area. In those regions of the IC that involve thin layers of semiconductor near the surface and having a conductivity type opposite to that of the underlying semiconductor, trimming can be accomplished. Such regions can include layers that form resistors, diodes and transistors and can also include additional thin layers. Typically such structures exist to a depth of about a micron or less in the semiconductor surface and are typically overcoated with a protective oxide layer.

In one embodiment, a pair of JFET devices is fabricated into an IC with the pair acting as the input stage of a differential amplifier. The larger of the pair is identified and trimmed to achieve a precision matched pair to a tolerance not available using regular IC construction.

BRIEF DESCRIPTION OF THE DRAWING

FIG. 1 is a cross section of a JFET as it exists in a typical IC;

FIG. 2 is a schematic diagram of a test circuit useful to determine the properties of a JFET pair;

FIG. 3 shows a fragment of the topography of an IC showing a pair of JFETs and a trimming apparatus; and FIG. 4 is an enlarged cross section of one of the JFET devices of FIG. 3 showing the nature of a trimmed spot.

DESCRIPTION OF THE INVENTION

FIG. 1 shows a cross section of a typical thin layer JFET having a subsurface channel. The form commonly employed in monolithic IC construction is shown. It is to be understood that the drawing is not to scale. It is expanded or distorted so that the various parts can clearly be illustrated. Also, while a subsurface channel is shown and is currently preferred for IC construction, a single layer surface channel construction could be employed.

A P type substrate 10 has an N type epitaxial layer 11 deposited thereon. A P type isolation ring 12 is diffused completely through the epitaxial layer so as to isolate an N type tub of epitaxial material into which the JFET is to be fabricated. P type source and drain electrodes 13 and 14 are diffused into the tub and an N+ type gate contact 15 is diffused as shown. Electrodes 13-15 are diffused using conventional oxide masked planar diffusion processing. After the planar diffusions are completed the JFET channel region is constructed using ion implantation. A P type channel 16 is ion implanted and is overcoated with N type top gate 17 which not only covers channel 16 but overlaps so as to make ohmic contact to the epitaxial material. The oxide shown over the channel 16 and top gate 17 is typically a vapor deposited oxide applied at relatively low temperature to the ion implanted surface.

Source and drain regions are typically about 3 microns thick while the channel 16 is usually well under 1 micron in depth. Thus in the critical active region of the JFET, all of the device action is located within about a micron of the semiconductor surface.

While the channel 16 with top gate 17 is preferred, the JFET can be constructed without the top gate. In this case the P type channel extends up to the semiconductor-oxide interface. In relation to this invention and the following discussion, either form of construction can apply equally well.

As shown in FIG. 1, the source, drain, and gate electrodes are provided with planar metal contacts that extend through holes in the oxide 18. These are labeled 19, 20, and 21 respectively.

The characteristics of the JFET are controlled by the thickness and properties of the various layers and their doping densities along with the surface topography. In manufacture the processes are such that the various controlling parameters can be held to sufficient tolerance to permit reproduction on a mass manufacture scale. However, the devices will inevitably have individual differences.

I have discovered that under certain conditions, which will be disclosed hereinafter, thin semiconductor layers including those that make up the channel of a JFET, can be trimmed to produce a precise characteristic by the application of localized radiant energy. For example, with fixed bias potentials applied, the current passed by the JFET can be adjusted over a considerable range of values. It is only necessary that before adjustment the JFET pass in excess of the desired current.

My adjustment process has proven to be highly useful in matching the JFET devices that are to be used in pairs, such as the input stage of a differential amplifier. In this application a pair of JFETs, typically manufactured as an adjacent pair on a silicon IC substrate, is connected to the same bias sources. The larger device of the two is determined and then trimmed so as to produce a match. Depending upon the degree of care exercised, almost any degree of matching desired can be achieved. Since this could be the last step in IC fabrication, it would make possible the mass manufacture of balanced JFET IC devices that do not require external offset balancing.

With reference to FIG. 2, JFET devices 21 and 22 represent a pair destined for use as an input pair. Resistors 23 and 24 represent the matched load devices. For testing, the loads are coupled to a negative potential −V at terminal 25 applied with reference to ground. The two gates are coupled together and grounded as shown by the dashed lines. If desired, the gates could be returned to any suitable bias source. A voltmeter 26 is coupled between the JFET drains as shown. If the circuit were perfectly balanced, the voltmeter would read zero. If unbalanced, the larger JFET will have the higher (more positive) voltage. This is the JFET to be trimmed. Trimming is continued until the desired balance is achieved.

FIG. 3 shows an IC topography fragment that includes a pair of JFETs labeled 21 and 22. With relation to FIG. 1, JFET 21 of FIG. 3 has source 13 and drain 14 joined by channel 16 which is overlapped by top gate 17. JFET 22, while not so labeled, has similar elements. While not shown, JFETs 21 and 22 may be located in separate isolated tubs as described above. It will be assumed that due to manufacturing tolerances, JFET 21 passes more current for the same gate-source bias and it will be selected for trimming.

Radiant energy source 27 operated by control device 28 has its output focused by lens 29 onto the channel region 16 of JFET 21. The focused spot is shown at 30. While the trimming mechanism is not completely understood, it is believed that the localized heating of the semiconductor produces localized oxide growth and the surface of the semiconductor is consumed. It is thought that the showing of FIG. 4, which details the action as spot 30, illustrates the physical mechanism.

FIG. 4 is an expanded cross section of JFET 21 of FIG. 3 taken along the line 4—4 and showing the details in the vicinity of spot 30. It can be seen that the oxide originally designated as 18 is thicker in the region of spot 30 as induced by heat activated local growth. In so doing, layers 16 and 17 have been penetrated. Since layer 16 is typically less than about one micron below the semiconductor surface, the increased oxide penetration is not very great. Even if the penetration only reached part way through channel layer 16, any penetration would act to reduce channel conductivity.

Control 28 is used to operate source 27 to produce the desired energy and duration of radiation. In addition, control 28 can act to translate source 27 so that the point of beam impingement can be controlled. Generally the trimming of a JFET channel should be confined to the central portion, as shown in FIG. 3. At least locations close to source and drain electrodes should be avoided. If the trimming produced by a single spot 30 is not adequate, the source can be translated and additional trimming performed such as is shown at spots 31 and 32. However many spots as are needed for trimming are employed to achieve the desired result. As an alternative, source 27 can be turned on and translated while on to produce a line trim as shown at 33. Line 33 is shown extending to outside of channel 16, but it could be located entirely within.

Source 27 can be any radiant energy source capable of heating the semiconductor. If desired, an electron beam could be used, but would require operation inside a vacuum. The preferred source is a laser, which can be precisely focused and controlled. The laser wavelength is selected to be near the absorption edge of the semiconductor being trimmed. Silicon is readily trimmed with a laser operation at about 1 micron. At this wavelength, the oxide is transparent and most of the energy is absorbed in the semiconductor itself close to the silicon surface. The laser can be operated in the pulsed mode or continuously. When pulsed each pulse contributes to trimming until the channel is fully penetrated. If desired, pulsing and translation can be employed. In the pulsed mode, the precise degree of trimming can easily be controlled because the energy deposited per pulse is quite reproducible. In the continuous mode, the most rapid trimming is achieved, especially with simultaneous translation. However, this is the most difficult trimming mode to control.

In the trimming operation, the trim rate for a particular JFET structure and trimming device can be established. In operation the JFET can be measured and the degree of required trim estimated and the trim accomplished. Alternatively a succession of trim-measurement cycles can be completed until the measurement arrives at the desired value. The concept of trimming in combination with measurement is well known in the thick and thin film arts and the techniques used in those arts can be applied to trimming the thin semiconductor layers by simply employing higher accuracy laser optics and beam positioning mechanisms.

EXAMPLE

Integrated circuit devices, known as LF156 microcircuits, were manufactured to have their input circuit JFET devices matched to within 2%. A Korad model Ky2Q YAG laser operating at 1.06 micron was adjusted to produce continuous operation at about 5 milliwatts. The laser beam was focused to a spot diameter of about 0.4 mil to produce a power density of about 40,000 watts per square inch. Line trimming, such as the one designated 33 in FIG. 2, was applied to the larger JFET to achieve a better match. The result was a matching of the devices to within 0.1%, an improvement of 20:1.

While the above example shows the trimming of a subsurface channel JFET, the process operates equally well with JFET structures where the channel is at the semiconductor surface. Such a structure would appear similar to that shown in FIG. 1, except that only one layer would exist in the semiconductor between electrodes 13 and 14. Since the trimmed layers are located in a monolithic semiconductor, it is clear that high value ion implanted resistors, diodes, bipolar transistors, and JFETs can be trimmed after conventional manufacture to precise values. Such devices have traditionally been regarded as untrimmable. Accordingly, this discovery is considered to produce highly useful and unexpected results.

The invention has been described and its application and performance have been detailed. However, there will be still other alternatives and equivalents that will occur to a person skilled in the art when exposed to the above disclosure. It is therefore intended that this disclosure is to be regarded as illustrative and that the scope of the invention be limited only by the following claims.

I claim:

1. The process for altering the conductivity of a layer of semiconductor located in a semiconductor body, said layer being characterized as having a conductivity type opposite to that of said body and extending below the surface of said body to a depth of less than about a micron to create an area p n junction therewith, said process comprising:

applying radiant energy to said body in the region of said layer, said energy being of a wavelength and a magnitude to produce a reaction in said layer thereby to alter the conductivity of said layer; and maintaining the level of said radiation below a value that would damage said p n junction.

2. The process of claim 1 wherein said energy is monochromatic and said wavelength is selected to be near the optical absorption peak of said semiconductor.

3. The process of claim 1 wherein said layer is the channel region of a JFET.

4. The process of claim 1 wherein said layer forms a resistor in said semiconductor.

5. The process of claim 1 wherein said layer forms one electrode of a diode.

6. The process of claim 1 wherein said layer forms one electrode in a bipolar transistor.

7. The method of matching a pair of JFET devices incorporated into a monolithic semiconductor integrator circuit, said JFET devices each including source, drain, and channel region with said channel region including a layer of semiconductor of a type opposite to that of the underlying material, said method comprising the steps:

determining the more conductive one of said JFET pair;

applying radiant energy to said channel region of said more conductive one, said radiant energy being of a wavelength and magnitude to cause a reaction in said channel region; and continuing said application of radiant energy until said pair is matched.

8. The method of claim 7 wherein said semiconductor is silicon and said wavelength is selected to be about one micron.

9. The method of claim 7 wherein said layer is located less than about a micron below the surface of said semiconductor.

10. The method of claim 8 wherein said energy is selected to be about 40,000 watts per square inch.

11. The method of claim 10 wherein radiant energy is produced by a laser focused to a spot small with respect to said channel.

12. The method of claim 11 wherein said laser is pulsed.

13. The method of claim 11 wherein said laser is continuously operated while trimming.

14. The method of claim 11 wherein said spot is translated during said trimming.

* * * * *